Nov. 21, 1961 R. N. NOYCE 3,010,033

FIELD EFFECT TRANSISTOR

Filed Jan. 2, 1958

ROBERT N. NOYCE
INVENTOR.

BY [signature]
ATTORNEYS

United States Patent Office 3,010,033 Patented Nov. 21, 1961

3,010,033

FIELD EFFECT TRANSISTOR

Robert N. Noyce, Los Altos, Calif., assignor, by mesne assignments, to Clevite Corporation, Cleveland, Ohio, a corporation of Ohio Filed Jan. 2, 1958, Ser. No. 706,816
4 Claims. (Cl. 307—88.5)

Figure 1:
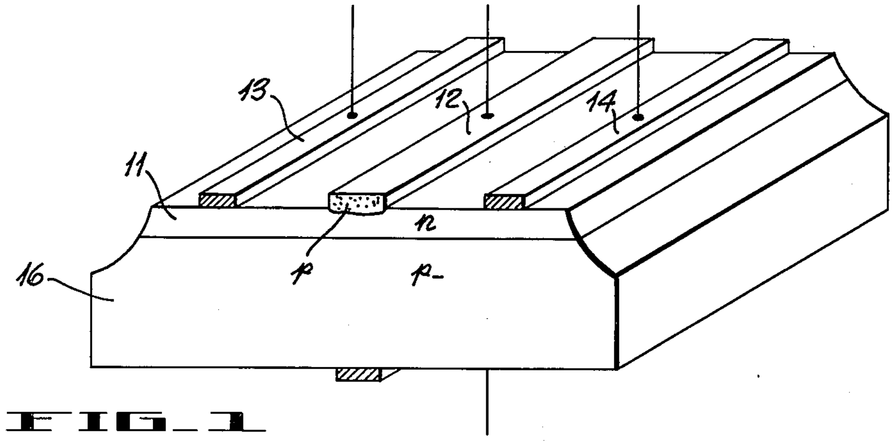

This invention relates generally to a field effect transistor, and more particularly to a high frequency field effect transistor.

Generally, in field effect transistors, the cross-sectional area of an n-type or p-type ohmic conducting "channel" is varied by forming one or more rectifying junctions therewith and varying the space charge region extending into the channel by applying signals to the junctions. These regions forming junctions with the channel are called the "gates" which serve to control or gate the flow of carriers through the channel.

As higher and higher frequency field effect transistors are made, it becomes necessary to make the channel narrower and narrower whereby the space charge may effectively control the flow of carriers. However, as structures are made smaller and smaller, they must be supported on a suitable structure of one type or another. For example, the structure may be supported on a block which is made of intrinsic material.

However, when the structures are supported on a block of nearly intrinsic material, the output and input capacitances are increased. Further, there is substantial increase in the drain to gate feedback capacitance particularly if the block is made part of the gate structure.

It is also desirable in certain instances to be able to ground the field effect transistor for R.-F. signals.

It is a general object of the present invention to provide an improved high frequency field effect transistor.

It is another object of the present invention to provide a field effect transistor which may be grounded for R.-F. duces relatively small input and output capacitances.

It is a further object of the present invention to provide a field effect transistor which may be grounded for r-f frequencies.

These and other objects of the present invention will become more clearly apparent from the following description when taken in conjunction with the accompanying drawing.

Figure 2:
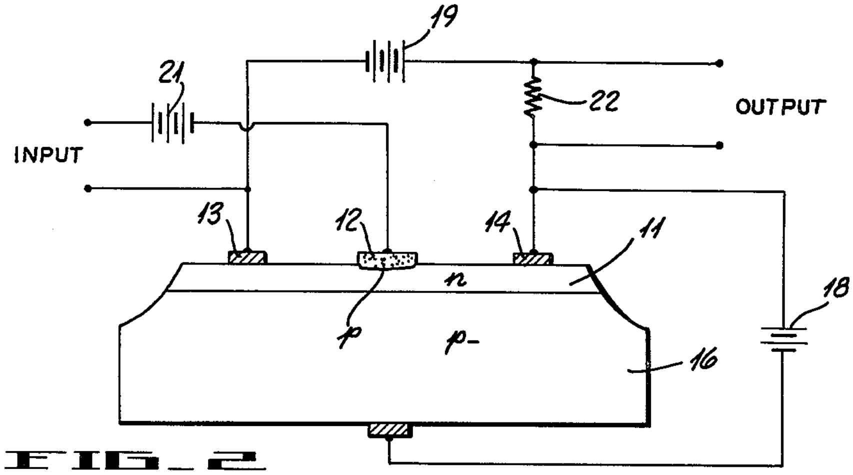
Figure 3:
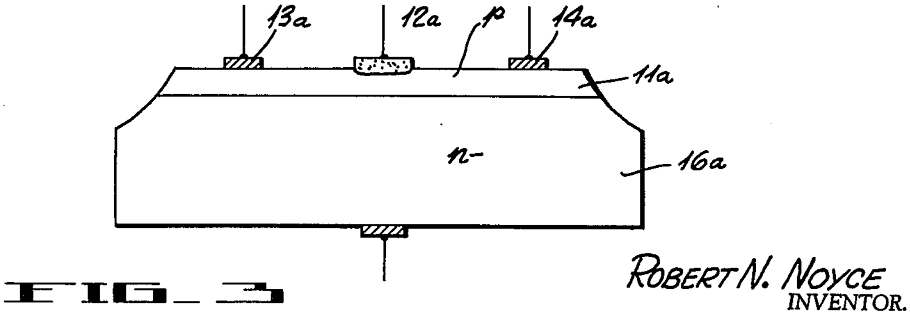

Referring to the drawing:

FIGURE 1 is a perspective view of a field effect transistor incorporating the present invention; and FIGURE 2 shows a typical circuit connection for the field effect transistor illustrated in FIGURE 1; and FIGURE 3 shows a field effect transistor of opposite conductivity types.

In general, the transistor structure is supported on a block or support made of material which forms a junction with the channel region and which may be reverse biased to decrease the capacitance between it and the active elements of the transistor. The block may be grounded for R.-F. signals.

Referring to FIGURE 1, a field effect transistor incorporating the present invention is illustrated. The transistor includes a n-type channel region 11 and a p-type region 12 forming a junction therewith and serving as a gate to control the space charge region in the underlying channel. The gate diode or junction may be formed by alloying techniques whereby a suitable rectifying junction is formed between the n-type channel and the p-type gate. Suitable source and drain contacts 13 and 14 are formed at spaced intervals along the channel.

As previously described, it is desirable to make the channel thickness as small as possible whereby the transistor may be operated at relatively high frequencies. Such structures, however, must be supported. The present invention contemplates supporting the structure on a support 16 which forms a rectifying junction 17 with the channel region. For example, the region 16 may be a p-type region which is not highly doped. By applying suitable reverse bias to the junction 17, the support 16 is isolated from the field effect transistor structure and may be grounded to R.-F.

Referring particularly to FIGURE 2, suitable power supplies are illustrated. Thus, a voltage 18 is supplied between the channel region 11 and the base support 16 whereby the junction 17 is reversed biased. A suitable driving voltage 19 is applied between the source and drain connections 13 and 14 and a suitable bias voltage 21 is applied to the gate region 12. The input signal is applied between the source 13 and drain 14, and the output is obtained across the output load resistor 22.

It is, of coures, apparent that the field effect transistor may be formed with opposite conductivity types than those described. Referring to FIGURE 3, the transistor includes a p-type channel region with an n-type gate and an n-type support.

Thus, there is provided a transistor suitable for high frequency operation. The transistor is supported on a support which forms a junction therewith and which may be suitably biased to isolate the operating regions of the transistor from the support. The interelectrode capacitances are reduced.

I claim:

1. A field effect transistor including a first region of one conductivity type, source and drain connections spaced apart thereon, a second region of opposite conductivity type disposed between said source and drain connections and forming a junction with predetermined concentration gradient with said first region, a gate connection to said second region, a third region of opposite conductivity type serving to support said first region and forming a second junction therewith, said second junction having a concentration gradient substantially smaller than the concentration gradient junction between the first and second regions.

2. A field effect transistor including a first relatively thin region of semiconductive material of one conductivity type, source and drain connections spaced apart thereon, a second region of semiconductive material of opposite conductivity type disposed between said source and drain connections and forming a rectifying junction with said first region, a gate connection to said second region, and a support of semiconductive material of opposite conductivity type supporting said first region and forming a junction therewith, said support region having an impurity concentration which is less than that in the second region.

3. A field effect transistor including a first region of semiconductive material of one conductivity type, source and drain connections spaced apart on one surface of said region, a second region of semiconductive material of opposite conductivity type disposed on the same surface between said source and drain connections and forming a first junction with a limited area of said first region, a gate connection to said second region, a support of semiconductive material of opposite conductivity type serving to support said first region and forming a second junction with the other surface of the same, said second junction having a concentration gradient substantially smaller than that of the first junction, and means for reverse biasing said second junction to isolate the support from the first region.

4. A field effect transistor including a first region of semiconductive material of one conductivity type, source and drain connections spaced apart thereon, a second region of semiconductive material of opposite conductivity type disposed between said source and drain connections, said second region having a predetermined concentration of unbalanced impurities characterizing said conductivity type, a gate connection to said second region, and a third region of semiconductive material of opposite conductivity type serving to support said first and second regions and forming a second junction therewith, said third region having a concentration of unbalanced impurities characterizing said conductivity type which is substantially smaller than the concentration of impurities characterizing the second region.

References Cited in the file of this patent

UNITED STATES PATENTS

| | | |
|---|---|---|
| 2,778,885 | Shockley | Jan. 22, 1957 |
| 2,791,758 | Looney | May 7, 1957 |
| 2,820,154 | Kurshan | Jan. 14, 1958 |